(12) United States Patent
Ishibashi et al.

(10) Patent No.: US 8,815,710 B2
(45) Date of Patent: Aug. 26, 2014

(54) SILICON EPITAXIAL WAFER AND METHOD FOR PRODUCTION THEREOF

(75) Inventors: Masayuki Ishibashi, Tokyo (JP); Shinji Nakahara, Tokyo (JP); Tetsuro Iwashita, Tokyo (JP)

(73) Assignee: Sumco Corporation, Tokyo (JP)

( * ) Notice: Subject to any disclaimer, the term of this patent is extended or adjusted under 35 U.S.C. 154(b) by 690 days.

(21) Appl. No.: 12/988,156

(22) PCT Filed: Apr. 17, 2009

(86) PCT No.: PCT/JP2009/057759
§ 371 (c)(1),
(2), (4) Date: Oct. 15, 2010

(87) PCT Pub. No.: WO2009/150896
PCT Pub. Date: Dec. 17, 2009

(65) Prior Publication Data
US 2011/0031592 A1 Feb. 10, 2011

(30) Foreign Application Priority Data

Jun. 10, 2008 (JP) ................................. 2008-151980

(51) Int. Cl.
| | |
|---|---|
| H01L 29/04 | (2006.01) |
| H01L 21/20 | (2006.01) |
| H01L 21/306 | (2006.01) |
| C30B 25/20 | (2006.01) |
| C30B 29/06 | (2006.01) |
| H01L 21/02 | (2006.01) |
| C30B 33/00 | (2006.01) |
| C30B 25/18 | (2006.01) |

(52) U.S. Cl.
CPC .......... *H01L 21/30625* (2013.01); *C30B 25/20* (2013.01); *C30B 29/06* (2013.01); *H01L 21/02609* (2013.01); *H01L 21/02381* (2013.01); *H01L 21/02587* (2013.01); *H01L 21/02532* (2013.01); *C30B 33/00* (2013.01); *C30B 25/186* (2013.01)
USPC ........................... 438/478; 257/627; 428/446

(58) Field of Classification Search
USPC ............................ 257/627; 428/446; 438/478
See application file for complete search history.

(56) References Cited

U.S. PATENT DOCUMENTS

| | | | | |
|---|---|---|---|---|
| 7,816,765 B2 * | 10/2010 | Ono | ............................ | 257/613 |
| 2002/0022351 A1 * | 2/2002 | Schmolke et al. | ............ | 438/504 |

(Continued)

FOREIGN PATENT DOCUMENTS

| | | |
|---|---|---|
| JP | 03-295235 | 12/1991 |
| JP | 05-326467 | 12/1993 |

(Continued)

OTHER PUBLICATIONS

Taiwan Office action, mail date is Jul. 12, 2012.
U.S. Appl. No. 12/897,907 to Hideki Nishihata et al., which was filed on Oct. 5, 2010.
U.S. Appl. No. 12/887,815 to Hideaki Kinbara et al., which was filed on Sep. 22, 2010.

(Continued)

*Primary Examiner* — Long K Tran
*Assistant Examiner* — Jordan Klein
(74) *Attorney, Agent, or Firm* — Greenblum & Bernstein, P.L.C.

(57) ABSTRACT

Disclosed is a wafer having a good haze level in spite of the fact that the inclination angle of {110} plane in the wafer is small. Also disclosed is a method for producing a silicon epitaxial wafer, which comprises the steps of: growing an epitaxial layer on a silicon single crystal substrate having a main surface of {110} plane of which an off-angle is less than 1 degree; and polishing the surface of the epitaxial layer until the surface of the epitaxial layer has a haze level of 0.18 ppm or less (as measured by SP2 at a DWO mode).

8 Claims, 2 Drawing Sheets

(56) References Cited

U.S. PATENT DOCUMENTS

| | | | |
|---|---|---|---|
| 2005/0275102 A1* | 12/2005 | Ahn | 257/754 |
| 2006/0068568 A1* | 3/2006 | Yanase | 438/478 |
| 2006/0131553 A1* | 6/2006 | Yamanaka et al. | 257/1 |
| 2007/0023066 A1* | 2/2007 | Yokokawa et al. | 134/1.3 |
| 2008/0048300 A1* | 2/2008 | Yanase | 257/627 |
| 2008/0053368 A1* | 3/2008 | Inami et al. | 117/19 |
| 2008/0057323 A1* | 3/2008 | Dohi et al. | 428/446 |
| 2008/0057324 A1* | 3/2008 | Nakahara et al. | 428/446 |
| 2009/0304975 A1* | 12/2009 | Sugimoto et al. | 428/64.1 |
| 2010/0288192 A1* | 11/2010 | Okuuchi | 117/97 |

FOREIGN PATENT DOCUMENTS

| | | |
|---|---|---|
| JP | 2004-265918 | 9/2004 |
| JP | 2005-39111 | 2/2005 |
| JP | 2006-100596 | 4/2006 |
| JP | 2006-120939 | 5/2006 |
| JP | 2008-088051 | 4/2008 |

OTHER PUBLICATIONS

U.S. Appl. No. 13/003,440 to Masaya Sakurai et al., which was filed on Jan. 10, 2011.

* cited by examiner

SILICON EPITAXIAL WAFER AND METHOD FOR PRODUCTION THEREOF

TECHNICAL FIELD

This invention relates to a P/P-type silicon epitaxial wafer and a production method of the same.

BACKGROUND ART

As is known in the art, a silicon wafer having a {110} plane as the main surface allows the carrier mobility in a pMOS transistor to be higher than that of a wafer having a {100} plane as the main surface, thereby being used to provide high speed pMOS transistors.

From another aspect, an epitaxial wafer is used as a material for high performance devices because of having significantly few defects in an epitaxial layer. As such, an epitaxial wafer having a {110} plane as the main surface is expected to present remarkable properties as a material for high performance devices, such as an MPU.

However, an epitaxial wafer having a {110} plane as the main surface tends to generate a tarnish referred to as haze, and therefore it becomes difficult even to measure LPD (Light Point Defects) using a particle counter possibly with difficulty to perform quality assurance of wafers.

Against such difficulties, known in the art is to grow an epitaxial layer on a silicon single crystal substrate having an off-angle in the range of 0.5 degree to 3 degrees toward the <100> axis direction, thereby reducing the haze level (Patent Document 1).

PRIOR ART DOCUMENTS

Patent Documents

[Patent Document 1] Japanese Patent Application Publication 2005-39111

SUMMARY OF THE INVENTION

Problem to be Solved by the Invention

According to the above method described in Patent Document 1, however, the inclined {110} plane causes carriers to collide with the inclined lattice possibly deteriorating the carrier mobility, and the haze level at the surface is insufficient.

The problem to be solved by the present invention or the object is to provide a wafer with good haze level even though the {110} plane thereof has less inclination angle.

Means for solving the Problems

[1] A method for producing a silicon epitaxial wafer according to the first invention is characterized by comprising the steps of: growing an epitaxial layer on a silicon single crystal substrate having a main surface of {110} plane of which an off-angle is less than one degree; and polishing a surface of the epitaxial layer until a haze level at the surface of the epitaxial layer becomes to be 0.18 ppm or less (as measured by SP2 in a DWO mode).

[2] A method for producing a silicon epitaxial wafer according to the second invention is characterized by comprising the steps of: growing an epitaxial layer on a silicon single crystal substrate having a main surface of {110} plane of which an off-angle is less than one degree; and polishing a surface of the epitaxial layer until root-mean-square RMS of a surface roughness at the surface of the epitaxial layer becomes to be 0.060 nm or less (as measured by an atomic force microscope AFM at an area of 10 μm square).

[3] A method for producing a silicon epitaxial wafer according to the third invention is characterized in that, in the above method for producing a silicon epitaxial wafer, a polishing depth in the polishing is in a range of 0.05 μm to 1 μm.

[4] In this case, it is preferred that, after processing the polishing, a haze level at the surface of the epitaxial layer is 0.18 ppm or less and root-mean-square RMS of a surface roughness at the surface of the epitaxial layer is 0.060 nm or less.

[5] A silicon epitaxial wafer according to the fourth invention comprises a silicon single crystal substrate having a main surface of {110} plane and an epitaxial layer grown on the silicon single crystal substrate, and is characterized by that: an off-angle of a silicon single crystal substrate to be grown thereon with the epitaxial layer is less than one degree; and a haze level at a surface of the epitaxial layer is 0.18 ppm or less (as measured by SP2 in a DWO mode).

[6] A silicon epitaxial wafer according to the fifth invention comprises a silicon single crystal substrate having a main surface of {110} plane and an epitaxial layer grown on the silicon single crystal substrate, and is characterized by that: an off-angle of a silicon single crystal substrate to be grown thereon with the epitaxial layer is less than one degree; and a surface roughness RMS at a surface of the epitaxial layer is 0.060 nm or less (as measured by an atomic force microscope AFM at an area of 10 μm square).

[7] A silicon epitaxial wafer according to the sixth invention comprises a silicon single crystal substrate having a main surface of {110} plane and an epitaxial layer grown on the silicon single crystal substrate, and is characterized by that a haze level at a surface of the epitaxial layer is 0.18 ppm or less (as measured by SP2 in a DWO mode), and root-mean-square RMS of a surface roughness at a surface of the epitaxial layer is 0.060 nm or less (as measured by an atomic force microscope AFM at an area of 10 μm square).

[8] A method for producing a silicon epitaxial wafer according to the seventh invention comprises the steps of: growing an epitaxial layer on a silicon single crystal substrate using an epitaxial apparatus; and polishing a wafer after having completed the growing and taken off from the epitaxial apparatus, and is characterized by that the polishing is performed until 10 hours elapse after taking off the wafer from the epitaxial apparatus.

[9] A method for producing a silicon epitaxial wafer according to the eighth invention is characterized by comprising the steps of: growing an epitaxial layer on a silicon single crystal substrate; and polishing concurrently both surfaces of the substrate.

[10] In this case, it is preferred that the silicon epitaxial wafer has a main surface of {110} plane.

Advantageous Effect of the Invention

According to the above-described invention, it is enabled to obtain a wafer with good haze level even though the {110} plane thereof has less inclination angle.

EMBODIMENTS FOR CARRYING OUT THE INVENTION

Figure 1:
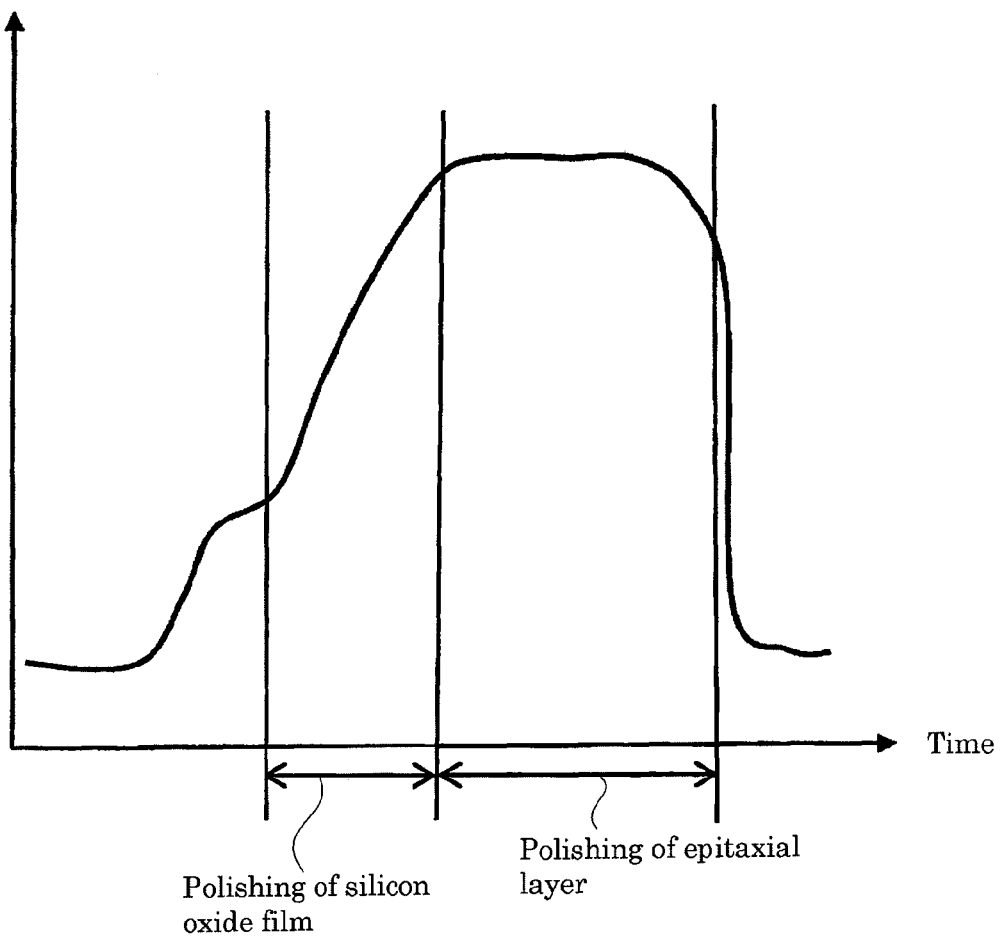
FIG. 1 is a graph illustrating a profile of motor load current when having polished a silicon epitaxial wafer.

Embodiments according to the above invention will be hereinafter described.

First Embodiment

The best mode of product according to the present embodiment may be obtained through growing an epitaxial layer on a silicon single crystal substrate having a {110} plane as the main surface, the off-angle thereof being less than one degree, and thereafter polishing the surface of the epitaxial layer.

In terms of wafers remaining surfaces epitaxially grown and wafers having polished surfaces thereon, haze levels at the surfaces of epitaxial layers were tested at DWO mode (Dark Field Wide Oblique mode) using Unpatterned Wafer Surface Inspection System (model: Surfscan SP2) available from KLA-Tencor Corporation.

In addition, surface roughness was measured at each area of 10 μm square using an atomic force microscope AFM and root-mean-square RMS of the surface roughness was calculated. The results thereof are represented in Table 1.

TABLE 1

| Inclination orientation | Polishing after epitaxial growth | | Off-angle (degrees) | | | | | | | | | | | |
|---|---|---|---|---|---|---|---|---|---|---|---|---|---|---|
| | | | 0 | .2 | .4 | .6 | .8 | 1 | 2 | 3 | 4 | 6 | 8 | 10 |
| <100> | None | Haze (ppm) | .9 | .3 | .2 | .15 | .1 | .9 | 1.1 | .25 | .35 | .55 | .7 | .85 |
| | | RMS (nm) | .3 | .25 | .2 | .16 | .11 | .15 | .65 | .9 | 1.3 | 1.5 | 1.7 | 1.85 |
| | Done | Haze (ppm) | .11 | .11 | .12 | .11 | .11 | .12 | .11 | .11 | .12 | .12 | .11 | .11 |
| | | RMS (nm) | .049 | .048 | .049 | .05 | .05 | .048 | .051 | .049 | .05 | .49 | .49 | .05 |
| <111> | Done | Haze (ppm) | .12 | .11 | .12 | .11 | .11 | .11 | .12 | .11 | .11 | .12 | .11 | .11 |
| | | RMS (nm) | .048 | .5 | .049 | .05 | .51 | .049 | .051 | .49 | .051 | .49 | .5 | .049 |
| <110> | Done | Haze (ppm) | .11 | .11 | .11 | .11 | .12 | .11 | .11 | .12 | .11 | .12 | .11 | .12 |
| | | RMS (nm) | .49 | .51 | .049 | .5 | .049 | .51 | .048 | .05 | .49 | .05 | .049 | .5 |

The polishing depth may be required as being 0.05 μm or more from a view point of improving the haze level. Although the upper limit thereof is not particularly limited, it may be sufficient to be 1 μm or less in the same view point.

Example 1

A p-type silicon single crystal ingot was produced with the main axis orientation of <110> and the diameter of 305 mm through the CZ method. After periphery grinding the ingot into 300 mm diameter and then notching, a plurality of blocks having electrical resistivity within the range of 5 to 10 mΩcm were cut out from the ingot. The blocks were sliced using wire saw into wafers with inclination orientations <100>, <111>, and <110> of the {110} plane each having off-angles 0 degree to 10 degrees relative to each orientation, as shown in Table 1.

Mirror polished wafers were obtained from the sliced wafers after processing through corner rounding, lapping, finishing corner rounding, etching, both surfaces polishing, tape corner rounding, minor polishing of edges, and one surface polishing of top surfaces, in this order. Although cleaning treatments between the above processes are omitted to be described, the wafers were cleaning treated in a similar way as a conventional wafer working process.

Thereafter, an epitaxial layer with thickness of 4 μm was grown using a single-wafer type epitaxial furnace. The wafer taken off from the epitaxial furnace was immediately passivation processed with SC-1 cleaning liquid. Subsets of the obtained wafers were polished by 0.3 μm at each surface of epitaxial layer using a one-surface polishing machine.

Epitaxial wafers polished after having formed thereon epitaxial layers according to Example 1 are constantly good not depending on the inclination orientations and off-angles.

The epitaxial wafer having a main surface of {110} plane in accordance with the production method of the present embodiment is finished with polishing. Therefore, the epitaxial wafer provides good haze level thereby allowing a quality assurance of LPD and the like using a particle counter, and is with less off-angle thereby being of advantage in carrier mobility.

Second Embodiment

Incidentally, epitaxial wafers have been used as materials for high performance devices because of the completeness in crystalline structure thereof. In accordance with miniaturization in device production processes during recent years, surface flatness and purity of epitaxial wafers are more severely demanded than ever before. To this end, known in the art is a method of polishing the surface after epitaxially growing (refer to Japanese Patent Application Publication 2006-120939, for example).

However, the wafer epitaxially processed in such a method is possibly to have been significantly deteriorated in haze level of the wafer surface when treated by polishing. If the haze level is high, then LPD is unable to be measured using a surface inspection system, and therefore the quality may not be evaluated.

Given the foregoing, the object of the present embodiment is to provide a method for producing a silicon epitaxial wafer free from an abnormal phenomenon that the haze level becomes possibly to be high when wet cleaning or polishing a wafer having been epitaxially processed.

The present inventors have found out the fact that the abnormal haze possibly to occur in the case of polishing a wafer occurred if the wafer was polished after 10 hours had elapsed from taking out the wafer from a epitaxial furnace.

Although the reason of the above is not obvious, it is inferred that some gas components in the atmosphere surrounding the wafer react with silicon atoms as the constituent element of the wafer to generate reaction products and thereby deteriorating the haze level at the time the reaction products are removed by polishing.

Example 2

A p-type silicon single crystal ingot was produced with the main axis orientation of <110> and the diameter of 305 mm through the CZ method. After periphery grinding the ingot into 300 mm diameter and then notching, a plurality of blocks having electrical resistivity within the range of 5 to 10 mΩcm were cut out from the ingot. The blocks were sliced using wire saw into wafers each with off-angle 0 degree.

Mirror polished wafers were obtained from the sliced wafers after processing through corner rounding, lapping, finishing corner rounding, etching, both surfaces polishing, tape corner rounding, mirror polishing of edges, and one surface polishing of top surfaces, in this order. Although cleaning treatments between the above processes are omitted to be described, the wafers were cleaning treated in a similar way as a conventional wafer working process.

Thereafter, an epitaxial layer with thickness of 5 μm was grown using a single-wafer type epitaxial furnace. The wafer taken off from the epitaxial furnace was immediately passivation processed with SC-1 cleaning liquid. The obtained wafer was put into a FOUP and maintained in a clean room during each assigned time, and thereafter was polished by 0.3 μm at the surface of epitaxial layer using a one-surface polishing machine.

In terms of such obtained wafers having polished epitaxial surfaces thereon, haze levels at the surfaces of epitaxial layers were tested at DWO mode (Dark Field Wide Oblique mode) using Unpatterned Wafer Surface Inspection System (model: Surfscan SP2) available from KLA-Tencor Corporation. The results thereof are represented in Table 2.

TABLE 2

| | Maintained time (hours) | | | | | |
|---|---|---|---|---|---|---|
| | 1 | 10 | 12 | 16 | 24 | 48 |
| Haze (ppm) | 0.05 | 0.05 | 0.10 | 0.35 | 1.50 | 1.55 |

While the haze level remains good within the elapsed time of 10 hours, the haze level steadily deteriorates after 10 hours have passed.

The epitaxial wafer obtained through the method according to the present embodiment is suitable as a wafer for devices because the wafer is free from an abnormal occurrence of haze and allows the LPD measurement to be steadily performed using a surface inspection system.

Third Embodiment

As described hereinbefore, epitaxial wafers have been used as materials for high performance devices because of the completeness in crystalline structure thereof. In accordance with miniaturization in device production processes during recent years, surface flatness of epitaxial wafers are more severely demanded than ever before. Known in the art as a method to improve the surface flatness is a method of polishing the surface after epitaxially growing (refer to Japanese Patent Application Publication 2006-120939, for example).

As is also known in the art, a silicon wafer having a main surface of {110} plane allows the carrier mobility in a pMOS transistor to be higher than that of a wafer having a main surface of {100} plane, thereby being used to provide high speed pMOS transistors.

On the other hand, an epitaxial wafer is used as a material for high performance devices because of having significantly few defects in an epitaxial layer. As such, an epitaxial wafer having a main surface of {110} plane is expected to present remarkable properties as a material for high performance devices, such as an MPU.

However, an epitaxial wafer having a main surface of {110} plane tends to generate a tarnish referred to as haze, and therefore it becomes difficult even to measure LPD using a particle counter possibly with difficulty to perform quality assurance of wafers.

The object of the present embodiment is to provide an epitaxial wafer with good surface flatness and less warpage.

The best mode of production method according to the present embodiment is a method of polishing, using an apparatus for polishing concurrently both surfaces, a wafer produced by a conventional method of producing an epitaxial wafer. The polishing depths of the both surfaces are not necessarily to be the same thickness, and may be intentionally different from each other by setting the rotational speeds for the both surfaces to be different from each other in the apparatus or using different polishing pad materials for the both surfaces, for example. When the rotational speeds are set different, the polishing depth of the surface at the side of higher rotational speed becomes to be larger. In addition, when the thicknesses of oxide layers are different for the both surfaces, the polishing depth of the surface with thinner oxide layer becomes to be larger.

The wafer, of which both surfaces have been polished after epitaxially growing, obtained according to the present embodiment has a property that the surface flatness is good and the haze level is also good. In addition, the use of a silicon single crystal substrate having a main surface of {110} plane enables to obtain an epitaxial wafer having a main surface of {110} plane with good haze level It is to be noted that the embodiments as explained above are described to facilitate understanding of the present invention and are not described to limit the present invention. Therefore, it is intended that the elements disclosed in the above embodiments include all substitutions, modifications and equivalents to fall within the scope of the present invention For example, in the process of polishing a wafer substrate having formed thereon an epitaxial layer, it is expected that a predetermined polishing depth (polishing amount) is definitely polished through setting the polishing time by a polishing platen as a predetermined value. However, because a silicon oxide layer is formed on the surface of the epitaxial layer and the thickness of the silicon oxide layer varies depending on the time duration elapsed after having been cleaned, there occurs an error in accordance with the polishing depth of the silicon oxide layer.

As a result of the inventors' researches, as shown in FIG. 1, there is observed a specific profile in the relationship between the load current of a motor for driving the polishing platen and the elapsed time during the polishing has been started at the silicon oxide, completed for the whole thereof, and thereafter transited to the epitaxial layer. More specifically, the motor load current tends to increase at the time of polishing the silicon oxide, while the motor load current maintains a constant value or tends to decrease after the transition to the polishing of the epitaxial layer.

Figure 2:
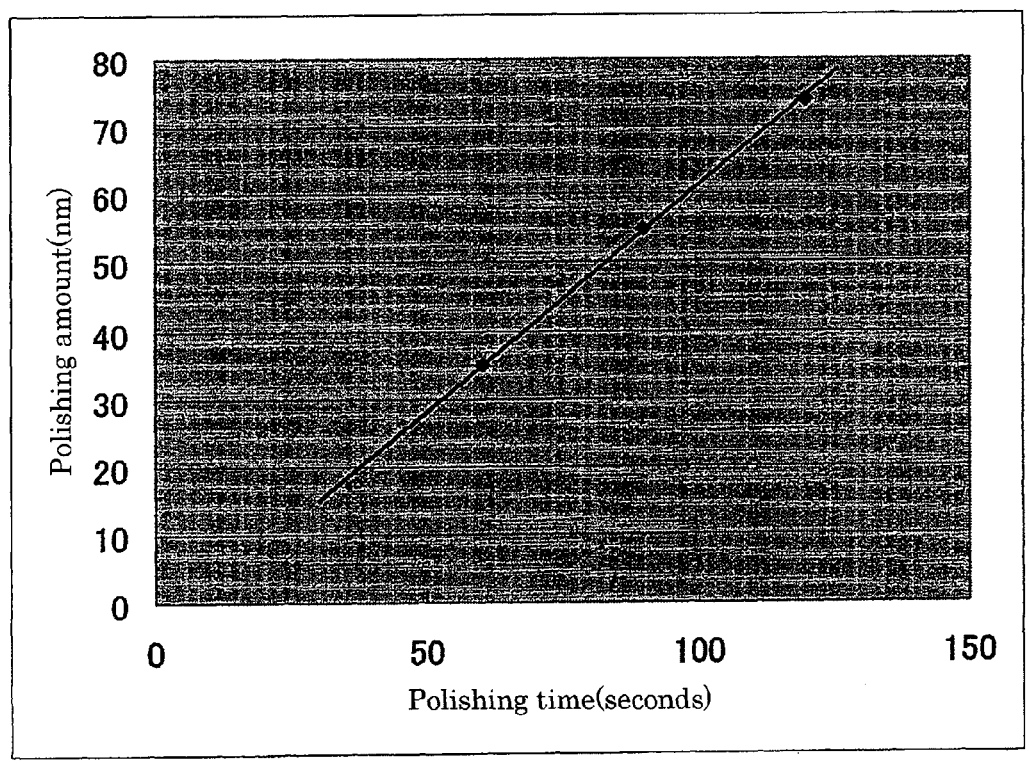
FIG. 2 is a graph illustrating the relationship between a polishing depth and a polishing time.

The polishing depth can be controlled based on the profile. More specifically, while detecting the load current of the motor, the polishing time duration is started to be measured after completing the polishing of the silicon oxide, and the polishing is performed to achieve a target polishing depth based on the relationship between the polishing depth or amount and the polishing time duration, as shown in FIG. 2.

The invention claimed is:

1. A method for producing a silicon epitaxial wafer, comprising:
   growing, using an epitaxial apparatus, an epitaxial layer on a silicon single crystal substrate having a main surface of {110} plane of which an off-angle is less than one degree; and
   polishing a surface of the epitaxial layer until a haze level at the surface of the epitaxial layer becomes to be 0.18 ppm or less, wherein the polishing is performed before 10 hours elapse and after completing the growing and taking a grown wafer off of the epitaxial apparatus.

2. The method for producing a silicon epitaxial wafer as recited in claim 1, wherein
   a polishing depth in the polishing is in a range of 0.01 μm to 1 μm.

3. The method for producing a silicon epitaxial wafer as recited in claim 2, wherein,
   after processing the polishing, a haze level at the surface of the epitaxial layer is 0.18 ppm or less and root-mean-square RMS of a surface roughness at the surface of the epitaxial layer is 0.060 nm or less.

4. The method for producing a silicon epitaxial wafer as recited in claim 1, wherein the polishing is concurrently performed on both sides of a board.

5. A method for producing a silicon epitaxial wafer, comprising:
   growing, using an epitaxial apparatus, an epitaxial layer on a silicon single crystal substrate having a main surface of {110} plane of which an off-angle is less than one degree; and
   polishing a surface of the epitaxial layer until root-mean-square RMS of a surface roughness at the surface of the epitaxial layer measured by an atomic force microscope AFM at an area of 10 μm square becomes to be 0.060 nm or less, wherein the polishing is performed before 10 hours elapse and after completing the growing and taking a grown wafer off of the epitaxial apparatus.

6. The method for producing a silicon epitaxial wafer as recited in claim 5, wherein
   a polishing depth in the polishing is in a range of 0.01 μm to 1 μm.

7. The method for producing a silicon epitaxial wafer as recited in claim 6, wherein,
   after processing the polishing, a haze level at the surface of the epitaxial layer is 0.18 ppm or less and root-mean-square RMS of a surface roughness at the surface of the epitaxial layer is 0.060 nm or less.

8. The method for producing a silicon epitaxial wafer as recited in claim 5, wherein the polishing is concurrently performed on both sides of a board.

* * * * *